(12) United States Patent
Funahashi et al.

(10) Patent No.: US 7,291,781 B2
(45) Date of Patent: Nov. 6, 2007

(54) COMPLEX OXIDE HAVING N-TYPE THERMOELECTRIC CHARACTERISTICS

(75) Inventors: Ryoji Funahashi, Ikeda (JP); Masahiro Shikano, Ikeda (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 115 days.

(21) Appl. No.: 10/507,868

(22) PCT Filed: Mar. 11, 2003

(86) PCT No.: PCT/JP03/02827

§ 371 (c)(1),
(2), (4) Date: Sep. 16, 2004

(87) PCT Pub. No.: WO03/081686

PCT Pub. Date: Oct. 2, 2003

(65) Prior Publication Data

US 2005/0211289 A1     Sep. 29, 2005

(30) Foreign Application Priority Data

Mar. 22, 2002  (JP) .............................. 2002-080258

(51) Int. Cl.
*H01L 35/12* (2006.01)
*H01L 29/10* (2006.01)
*C01B 13/00* (2006.01)

(52) U.S. Cl. .................. 136/236.1; 257/43; 423/593.1

(58) Field of Classification Search ............. 136/236.1, 136/238, 240; 257/467, 43; 423/21.1, 593.1, 423/596, 600, 617

See application file for complete search history.

(56) References Cited

U.S. PATENT DOCUMENTS

| 4,044,601 A | * | 8/1977 | Sakurai et al. ............. 73/31.02 |
| 5,728,481 A | * | 3/1998 | Kasai et al. ............. 428/811.2 |
| 2001/0016554 A1 | * | 8/2001 | Takeuchi ................... 502/303 |

FOREIGN PATENT DOCUMENTS

| JP | 08-229355 | 9/1996 |
| JP | 2000-211971 | 8/2000 |

OTHER PUBLICATIONS

CAPLUS entry for Savchenko et al. (Synthesis and electric properties of solid from the lanthanum sesquioxide-nickel monoxide-barium oxide system, Izvestiya Akademii Nauk SSR, Neorganicheskie Materialy (1987), 23(6), 973-6).*

(Continued)

*Primary Examiner*—Alex Noguerola
(74) *Attorney, Agent, or Firm*—Knobbe, Martens, Olson & Bear LLP

(57) ABSTRACT

The present invention provides a complex oxide having a composition represented by the formula $La_{1-x}M_xNiO_{2.7-3.3}$ or $(La_{1-x}M_x)_2NiO_{3.6-4.4}$ (wherein M is at least one element selected from the group consisting of Na, K, Li, Zn, Pb, Ba, Ca, Al, Nd, Bi and Y, and $0.01 \leq x \leq 0.8$), the complex oxide having a negative Seebeck coefficient at 100° C. or higher. This complex oxide is a novel material which exhibits excellent properties as an n-type thermoelectric material.

18 Claims, 5 Drawing Sheets

OTHER PUBLICATIONS

CAPLUS entry for Rao et al (A comparative study of the magnetic and electrical properties of perovskite oxides and the corresponsing two-dimensional oxides of dipotassium tetrafluoronickelate structure, Journal of Solid State Chemistry (1988), 72(1), 14-23).*

CAPLUS entry for Ganguli et al. ("Elusive superconductivity in polycrystalline samples of layered lanthanum nickelates," Solid State Communications (1989), 72(2), 195-7).*

* cited by examiner

● La, M
• Ni

LaNiO₃ structure (Examples 1 to 55)

● La, M
• Ni

La$_2$NiO$_4$ structure (Examples 56 to 110)

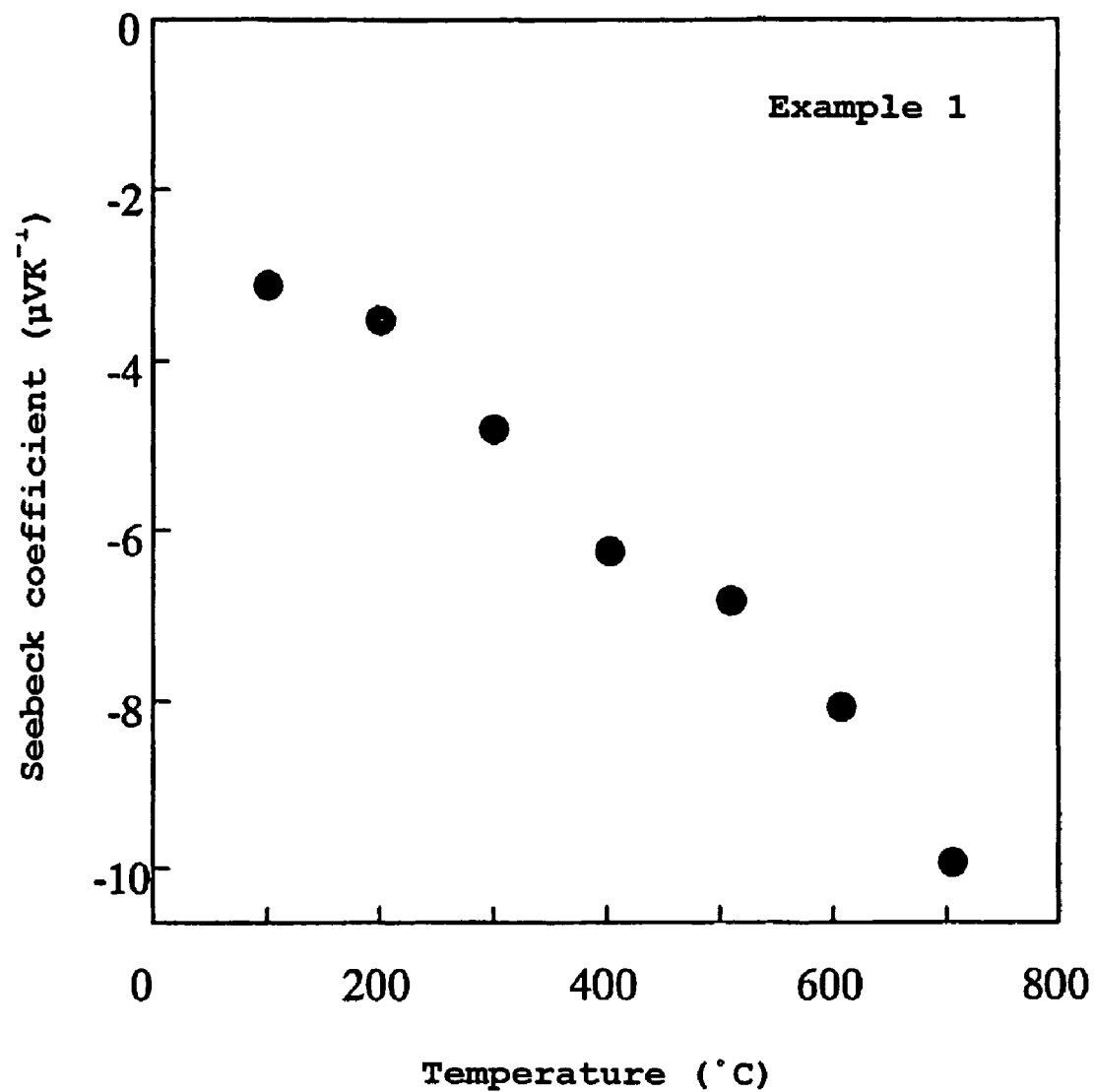

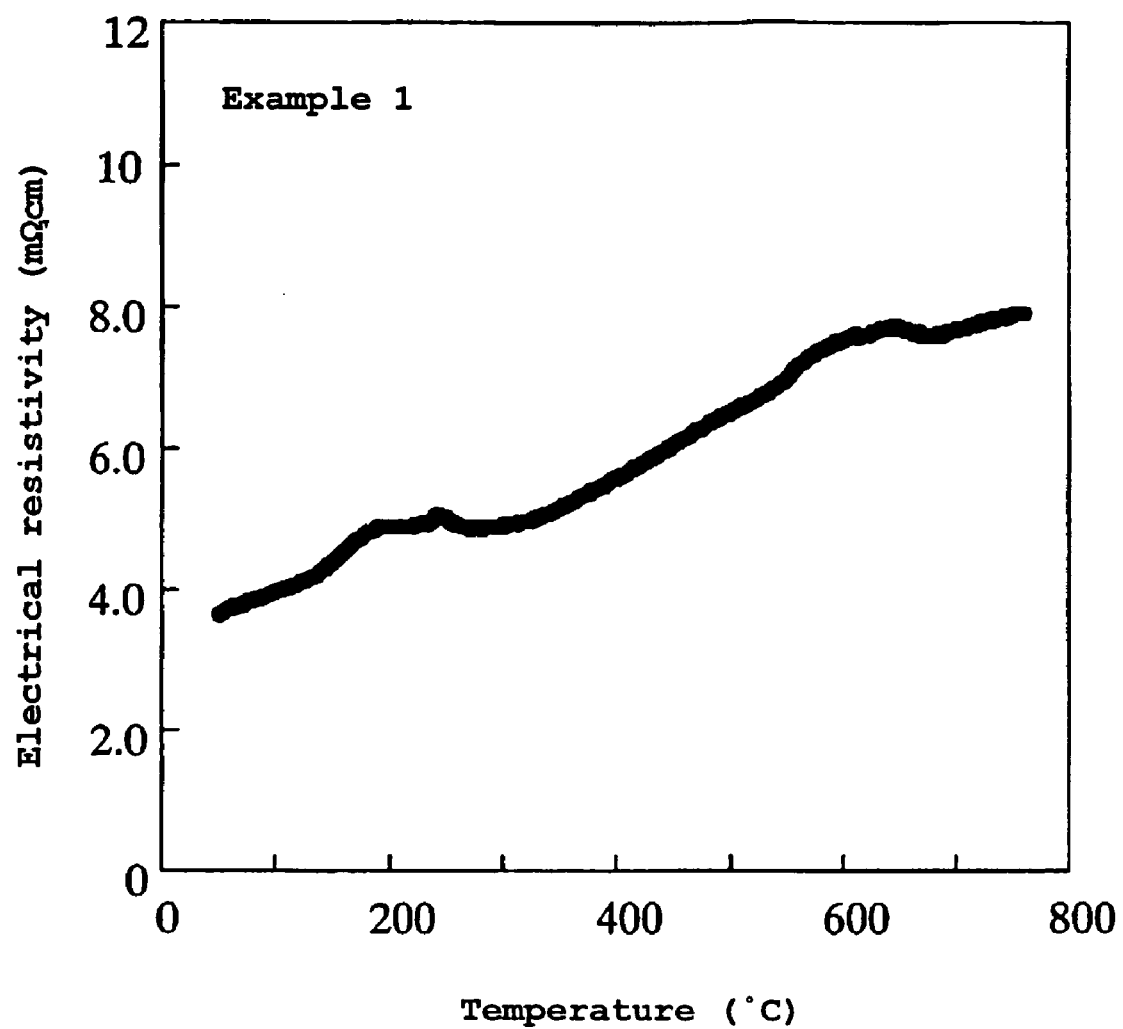

COMPLEX OXIDE HAVING N-TYPE THERMOELECTRIC CHARACTERISTICS

This application is the U.S. National Phase under 35 U.S.C. §371 of International Application PCT/JP03/02827, filed Mar. 11, 2003, which claims priority to Japanese Patent Application No. 2002-80258, filed Mar. 22, 2002. The International Application was not published under PCT Article 21(2) in English.

TECHNICAL FIELD

This invention relates to a complex oxide capable of achieving high performance as an n-type thermoelectric material, and an n-type thermoelectric material using the complex oxide.

BACKGROUND ART

In Japan, only 30% of the primary energy supply is used as effective energy, with about 70% being eventually lost to the atmosphere as heat. The heat generated by combustion in industrial plants, garbage-incineration facilities or the like is lost to the atmosphere without conversion into other energy. In this way, we are wastefully discarding a vast amount of thermal energy, while acquiring only a small amount of energy by combustion of fossil fuels or other means.

To increase the proportion of energy to be utilized, the thermal energy currently lost to the atmosphere should be effectively used. For this purpose, thermoelectric conversion, which directly converts thermal energy to electrical energy, is an effective means. Thermoelectric conversion, which utilizes the Seebeck effect, is an energy conversion method for generating electricity by creating a difference in temperature between both ends of a thermoelectric material to produce a difference in electric potential. In this thermoelectric generation, electricity is generated simply by setting one end of a thermoelectric material at a location heated to a high temperature by waste heat, and the other end in the atmosphere (room temperature) and connecting conductive wires to both ends. This method entirely eliminates the need for moving parts such as the motors or turbines generally required for power generation. As a consequence, the method is economical and can be carried out without releasing gases due to combustion. Moreover, the method can continuously generate electricity until the thermoelectric material has deteriorated.

Therefore, thermoelectric generation is expected to play a role in the resolution of future energy problems. To realize thermoelectric generation, large amounts of a thermoelectric material that has a high thermoelectric conversion efficiency and excellent heat resistance, chemical durability, etc. will be required.

$CoO_2$-based layered oxides such as $Ca_3CO_4O_9$ have been reported as substances that achieve excellent thermoelectric performance in the air at high temperatures. However, all such oxides have p-type thermoelectric properties, and are materials with a positive Seebeck coefficient, i.e., materials in which the portion located at the high-temperature side has a low electric potential.

To produce a thermoelectric module using thermoelectric conversion, usually not only a p-type thermoelectric material but also an n-type thermoelectric material are needed. However, n-type thermoelectric materials that have excellent heat resistance, chemical durability, etc., and have a high thermoelectric conversion efficiency have not yet been found. Therefore, thermoelectric generation using waste heat has not yet become practical.

In such circumstances, the development of n-type thermoelectric materials that are composed of abundantly available elements and have excellent heat resistance, chemical durability, etc., and have a high thermoelectric conversion efficiency is greatly desired.

BRIEF DESCRIPTION OF THE DRAWINGS

FIG. 4 is a graph showing the temperature dependency of the Seebeck coefficient of the sintered complex oxide prepared in Example 1.

FIG. 5 is a graph showing the temperature dependency of the electrical resistivity of the sintered complex oxide prepared in Example 1.

DISCLOSURE OF THE INVENTION

Figure 1:
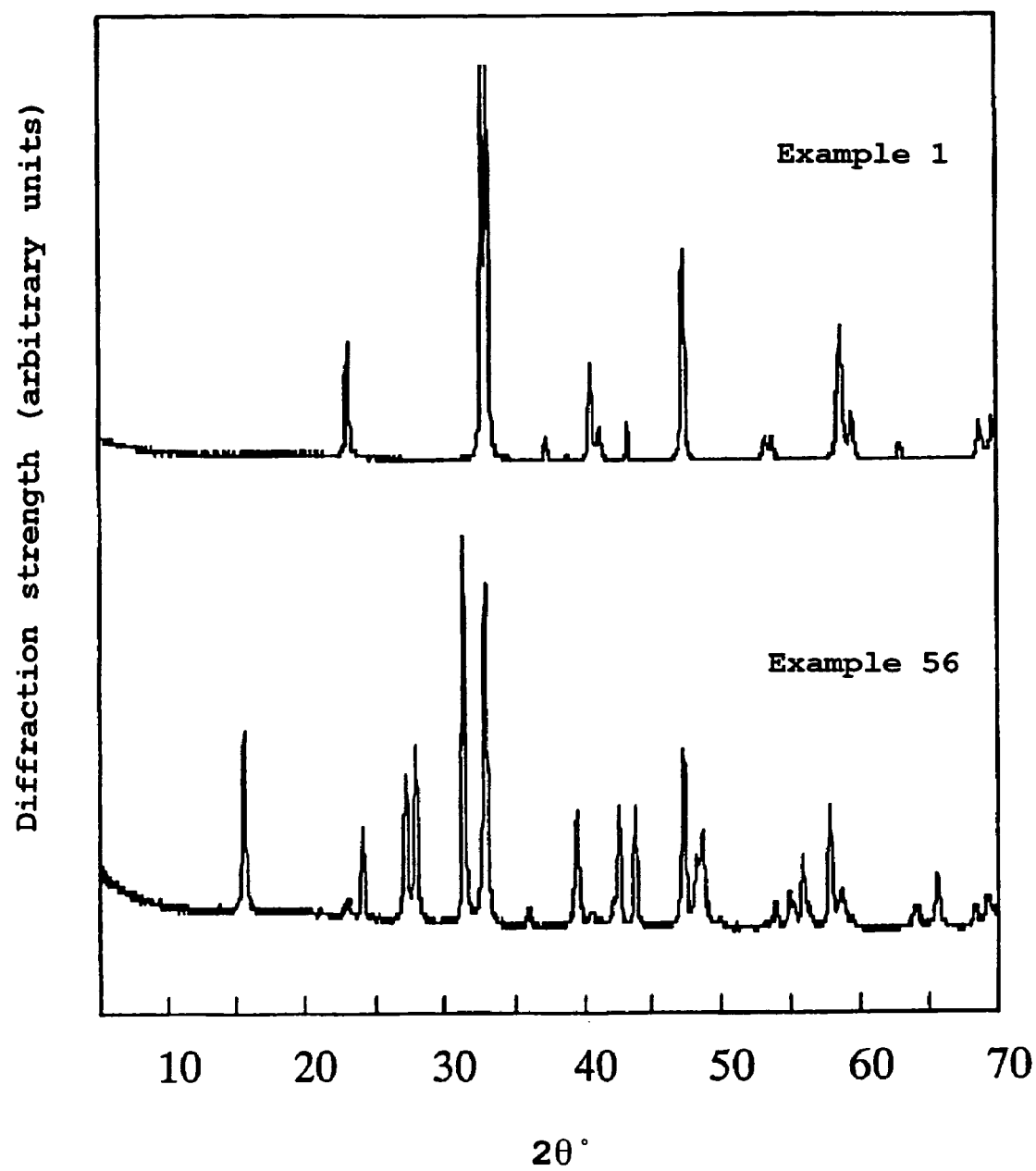
FIG. 1 shows X-ray diffraction patterns of the complex oxides obtained in Examples 1 and 56.

The present invention has been made to solve the above problems. A principal object of the invention is to provide a novel material that achieves excellent performance as an n-type thermoelectric material.

The present inventors conducted extensive research to achieve the above object and found that a complex oxide having a specific composition comprising La, Ni and O as essential elements and partially substituted by specific elements has a negative Seebeck coefficient and a low electrical resistivity, thus possessing excellent properties as an n-type thermoelectric material. The invention has been accomplished based on this finding.

The present invention provides the following complex oxides and n-type thermoelectric materials using the complex oxides.

1. A complex oxide having a composition represented by the formula $La_{1-x}M_xNiO_{2.7-3.3}$ wherein M is at least one element selected from the group consisting of Na, K, Li, Zn, Pb, Ba, Ca, Al, Nd, Bi and Y, and $0.01 \leq x \leq 0.8$, the complex oxide having a negative Seebeck coefficient at 100° C. or higher.

2. A complex oxide having a composition represented by the formula $La_{1-x}M_xNiO_{2.7-3.3}$ wherein M is at least one element selected from the group consisting of Na, K, Li, Zn, Pb, Ba, Ca, Al, Nd, Bi and Y, and $0.01 \leq x \leq 0.8$, the complex oxide having an electrical resistivity of 10 mΩcm or less at 100° C. or higher.

3. A complex oxide having a composition represented by the formula $(La_{1-x}M_x)_2NiO_{3.6-4.4}$ wherein M is at least one element selected from the group consisting of Na, K, Li, Zn, Pb, Ba, Ca, Al, Nd, Bi and Y, and $0.01 \leq x \leq 0.8$, the complex oxide having a negative Seebeck coefficient at 100° C. or higher.

4. A complex oxide having a composition represented by the formula $(La_{1-x}M_x)_2NiO_{3.6-4.4}$ wherein M is at least one element selected from the group consisting of Na, K, Li, Zn, Pb, Ba, Ca, Al, Nd, Bi and Y, and $0.01 \leq x \leq 0.8$, the complex oxide having an electrical resistivity of 10 mΩcm or less at 100° C. or higher.

5. An n-type thermoelectric material comprising the complex oxide of any one of items 1 to 4.

6. A thermoelectric module comprising the n-type thermoelectric material of item 5.

The complex oxide of the invention is an oxide whose composition is represented by the formula $La_{1-x}M_xNiO_{2.7-3.3}$ (hereinafter referred to as "complex oxide 1"), or an oxide whose composition is represented by the formula $(La_{1-x}M_x)_2NiO_{3.6-4.4}$ (hereinafter referred to as "complex oxide 2"). In complex oxides 1 and 2, M is at least one element selected from the group consisting of Na, K, Li, Zn, Pb, Ba, Ca, Al, Nd, Bi and Y, and is a value of 0.01 or more and 0.8 or less.

Complex oxides 1 and 2 have a negative Seebeck coefficient and exhibit properties as n-type thermoelectric materials in that when a difference in temperature is created between both ends of the oxide material, the electric potential generated by the thermoelectromotive force is higher at the high-temperature side than at the low-temperature side. More specifically, complex oxides 1 and 2 have a negative Seebeck coefficient at 100° C. or higher of, for example, about −1 to about −20 $\mu VK^{-1}$.

Furthermore, complex oxides 1 and 2 have good electrical conductivity and low electrical resistivity, and more specifically, an electrical resistivity of 10 mΩcm or less at 100° C. or higher.

FIG. 1 shows an X-ray diffraction pattern of the complex oxide obtained in Example 1 given below, i.e., one embodiment of complex oxide 1. FIG. 1 also shows an X-ray diffraction pattern of the complex oxide obtained in Example 56 given below, i.e., one embodiment of complex oxide 2.

The X-ray diffraction patterns, although showing the presence of small amounts of impurities, clearly indicate that complex oxide 1 has a perovskite-type crystal structure and complex oxide 2 has the so-called layered perovskite-type structure, thus being a perovskite-related material.

Figure 2:
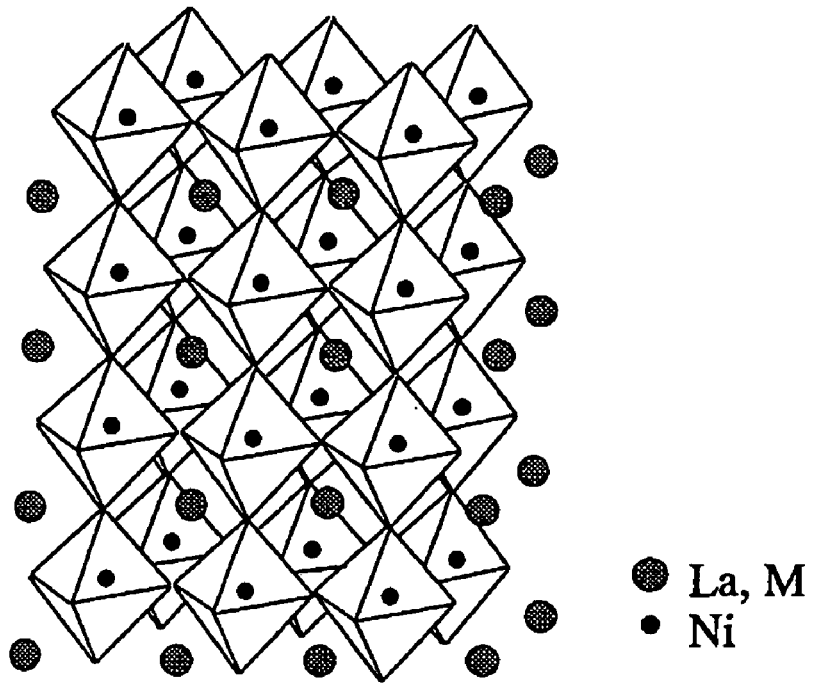
FIG. 2 schematically shows the crystal structures of complex oxides 1 and 2.
Figure 2:
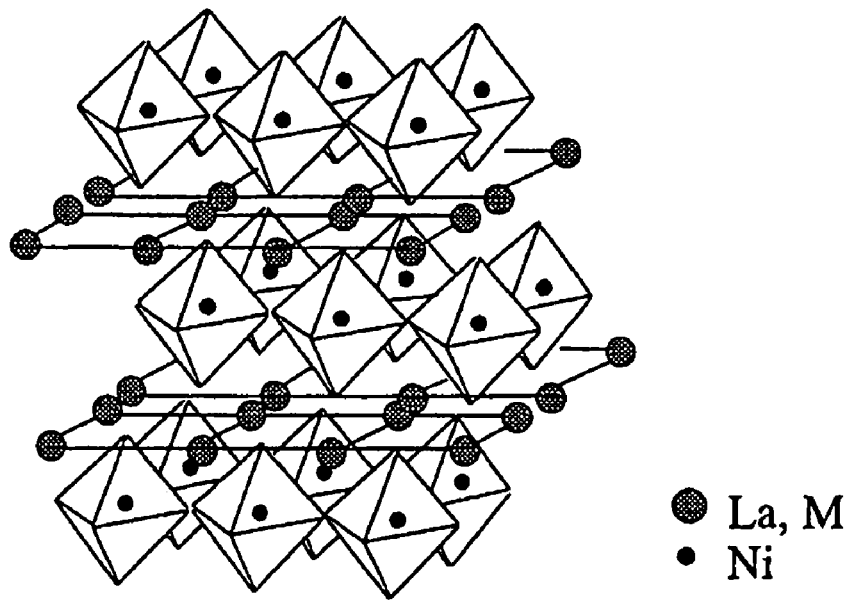

FIG. 2 schematically shows the crystal structures of complex oxides 1 and 2. As shown in FIG. 2, complex oxide 1 has a perovskite-type $LaNiO_3$ structure in which the La sites are partially substituted by M and complex oxide 2 has a layered perovskite-type $La_2NiO_4$ structure in which the La sites are partially substituted by M.

Complex oxides 1 and 2 can be prepared by mixing the starting materials in such a proportion so as to have the same metal component ratio as the desired complex oxide, followed by sintering. More specifically, the starting materials are mixed to have the same La/M/Ni metal component ratio as in the formula $La_{1-x}M_xNiO_{2.7-3.3}$ or $(La_{1-x}M_x)_2NiO_{3.6-4.4}$ (wherein M and x are as defined above) and the resulting mixture is sintered to provide the desired complex oxide.

The starting materials are not particularly limited insofar as they produce oxides when sintered. Examples of usable materials include metals, oxides, compounds (such as carbonates), and the like. Examples of usable sources of La are lanthanum oxide ($La_2O_3$), lanthanum carbonate ($La_2(CO_3)_3$), lanthanum nitrate ($La(NO_3)_3$), lanthanum chloride ($LaCl_3$), lanthanum hydroxide ($La(OH)_3$), lanthanum alkoxides (such as dimethoxylanthanum (La $(OCH_3)_3$), diethoxylanthanum ($La(OC_2H_5)_3$) and dipropoxylanthanum ($La(OC_3H_7)_3$), and the like. Examples of usable sources of Ni are nickel oxide (NiO), nickel nitrate (Ni $(NO_3)_2$), nickel chloride ($NiCl_2$), nickel hydroxide ($Ni(OH)_2$), nickel alkoxides (such as dimethoxynickel ($Ni(OCH_3)_2$), diethoxynickel ($Ni(OC_2H_5)_2$) and dipropoxynickel ($Ni(OC_3H_7)_2$), and the like. Similarly, examples of usable sources of other elements are oxides, chlorides, carbonates, nitrates, hydroxides, alkoxides and the like. Compounds containing two or more constituent elements of the complex oxide of the invention are also usable.

The sintering temperature and sintering time are not particularly limited insofar as the desired complex oxide can be produced under such conditions. For example, the sintering may be performed at about 850° C. to about 1000° C. for about 20 to about 40 hours. When carbonates, organic compounds or the like are used as starting materials, the starting materials are preferably decomposed by calcination prior to sintering, and then sintered to give the desired complex oxide. For example, when carbonates are used as starting materials, they may be calcined at about 600° C. to about 800° C. for about 10 hours, and then sintered under the above-mentioned conditions.

Sintering means are not particularly limited and any desired means such as electric furnaces and gas furnaces may be used. Usually, sintering may be conducted in an oxidizing atmosphere such as in an oxygen stream, or in the air. When the starting materials contain a sufficient amount of oxygen, sintering in an inert atmosphere, for example, is also possible.

The amount of oxygen in a complex oxide to be produced can be controlled by adjusting the partial pressure of oxygen during sintering, sintering temperature, sintering time, etc. The higher the partial pressure of oxygen is, the higher the oxygen ratio in the above formulae can be.

The thus obtained complex oxides 1 and 2 of the invention have a negative Seebeck coefficient and a low electrical resistivity, i.e., an electrical resistivity of 10 mΩcm or less at 100° C. or higher, so that the oxides exhibit excellent thermoelectric conversion capabilities as n-type thermoelectric materials. Furthermore, the complex oxides have good heat resistance and chemical durability and are composed of low-toxicity elements and therefore highly practical as thermoelectric conversion materials.

The complex oxides 1 and 2 of the invention with the above-mentioned properties can be effectively used as n-type thermoelectric materials in air at high temperatures.

Figure 3:
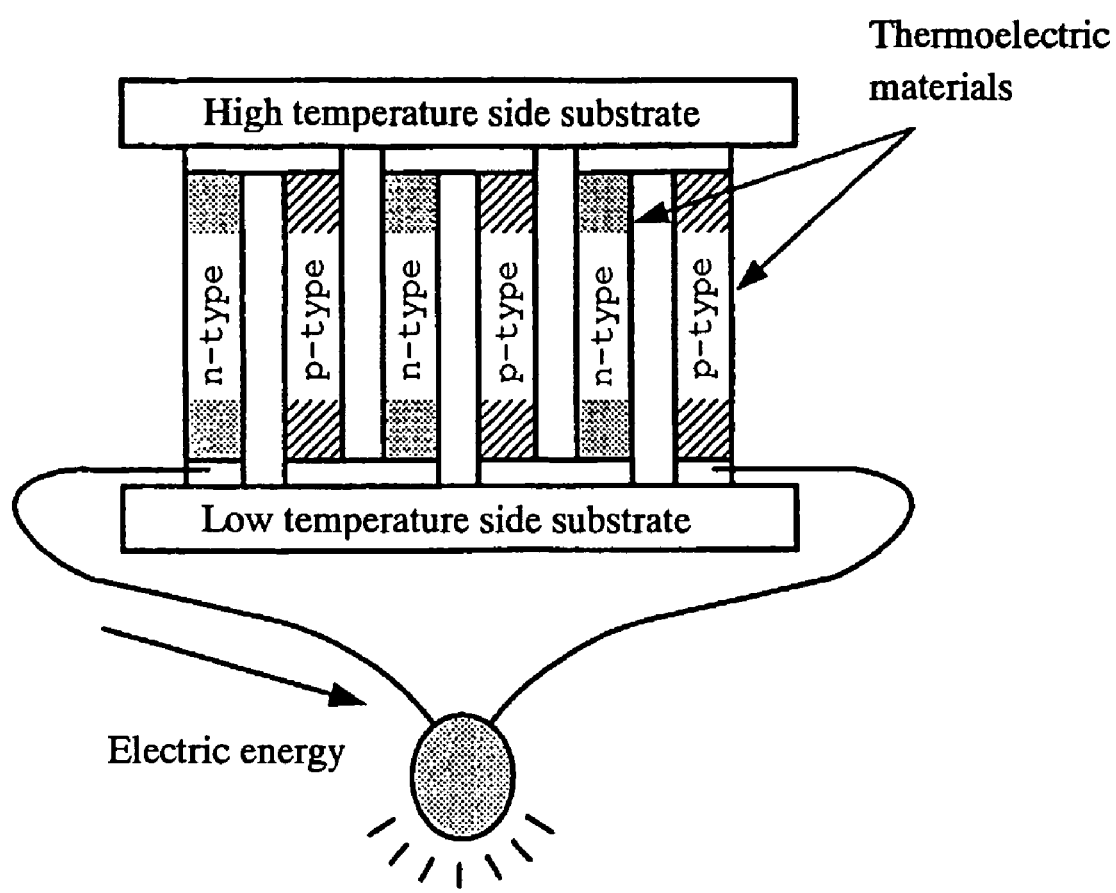
FIG. 3 is a schematic representation of a thermoelectric module comprising the complex oxide of the invention as a thermoelectric material.

FIG. 3 is a schematic representation of a thermoelectric module produced using a thermoelectric material comprising a complex oxide of the invention as its n-type thermoelectric elements. The thermoelectric module has a similar structure to conventional thermoelectric modules and comprises a high-temperature side substrate, a low-temperature side substrate, p-type thermoelectric materials, n-type thermoelectric materials, electrodes, and conductive wires. In such a module, the complex oxide of the invention is used as an n-type thermoelectric material.

As described above, the complex oxides of the invention have a negative Seebeck coefficient and a low electrical resistivity and are also excellent in terms of heat resistance, chemical durability, etc.

The complex oxides of the invention with such properties can be effectively utilized as n-type thermoelectric materials in air at high temperatures, whereas such use is impossible with conventional intermetallic compounds. Accordingly, by incorporating the complex oxides of the invention as n-type thermoelectric elements into a thermoelectric module, it becomes possible to effectively utilize thermal energy conventionally lost to the atmosphere.

BEST MODE FOR CARRYING OUT THE INVENTION

Examples are given below to illustrate the invention in further detail.

EXAMPLE 1

Using lanthanum carbonate ($La_2(CO_3)_3$) as a source of La, nickel oxide (NiO) as a source of Ni, and potassium carbonate ($K_2CO_3$) as a source of K, these starting materials were well mixed in a La/Ni/K ratio (element ratio) of 0.8:1.0:0.2. The mixture was placed into an alumina crucible and calcined in the air using an electric furnace at 600° C. for 10 hours to decompose the carbonates. The calcinate was milled and molded by pressing, followed by sintering in an oxygen stream at 920° C. for 40 hours to prepare a complex oxide.

The complex oxide thus obtained had a composition represented by the formula $La_{0.8}K_{0.2}NiO_{3.2}$.

FIG. 4 is a graph showing the temperature dependency of the Seebeck coefficient (S) of the obtained oxide over the temperature range of 100° C. to 700° C. It is apparent from FIG. 4 that the complex oxide has a negative Seebeck coefficient at 100° C. or higher, thus being confirmed to be an n-type thermoelectric material in which the high-temperature side has a high electric potential.

Like Example 1, in all the Examples described below, the Seebeck coefficient at 100° C. or higher was negative and showed a tendency to become more negative with a rise in temperature.

FIG. 5 is a graph showing the temperature dependency of the electrical resistivity of the complex oxide obtained in Example 1. FIG. 5 demonstrates that the complex oxide shows a low electrical resistivity, i.e., an electrical resistivity of about 10 mΩcm or less over the temperature range of 100° C. to 700° C.

EXAMPLES 2-110

Starting materials were mixed in the La/M/Ni ratios (element ratios) shown in Tables 1 to 4, and the same procedure as in Example 1 was then repeated to provide complex oxides.

The starting materials were those used in Example 1 and the following materials: sodium carbonate ($Na_2CO_3$) was used as a source of Na, lithium carbonate ($Li_2CO_3$) as a source of Li, zinc oxide (ZnO) as a source of Zn, lead oxide (PbO) as a source of Pb, barium carbonate ($BaCO_3$) as a source of Ba, calcium carbonate ($CaCO_3$) as a source of Ca, aluminium oxide ($Al_2O_3$) as a source of Al, neodymium oxide ($Nd_2O_3$) as a source of Nd, bisumuth oxide ($Bi_2O_3$) as a source of Bi, and yttrium oxide ($Y_2O_3$) as a source of Y.

The sintering temperature was selected from the range of 850° C. to 920° C. according to the desired complex oxide.

The complex oxides obtained in Examples 1 to 55 had a perovskite-type $LaNiO_3$ structure in which the La sites were partially substituted by M, whereas those obtained in Examples 56 to 110 had a layered perovskite-type $La_2NiO_4$ structure in which the La sites were partially substituted by M.

Tables 1 to 4 below show the element ratios of the obtained complex oxides, their Seebeck coefficients at 700° C., and their electrical resistivity at 700° C.

TABLE 1

Formula: $La_{1-x}M_xNiO_y$

| No. | M | La:M:Ni:O | Seebeck coefficient at 700° C. ($\mu VK^{-1}$) | Electrical resistivity at 700° C. (mΩcm) |
|---|---|---|---|---|
| 1 | K | 0.8:0.2:1:3.2 | −10 | 8 |
| 2 | K | 0.95:0.05:1:3.3 | −8 | 5 |
| 3 | K | 0.9:0.1:1:3.2 | −5 | 7 |
| 4 | K | 0.5:0.5:1:3.1 | −4 | 4 |
| 5 | K | 0.2:0.8:1:3.3 | −3 | 4 |
| 6 | Na | 0.99:0.01:1:3.2 | −7 | 7 |
| 7 | Na | 0.95:0.05:1:3 | −7 | 5 |
| 8 | Na | 0.9:0.1:1:2.9 | −3 | 8 |
| 9 | Na | 0.5:0.5:1:3.0 | −12 | 4 |
| 10 | Na | 0.2:0.8:1:2.8 | −5 | 6 |
| 11 | Li | 0.99:0.01:1:3.1 | −18 | 8 |
| 12 | Li | 0.95:0.05:1:3.2 | −10 | 9 |
| 13 | Li | 0.9:0.1:1:2.8 | −5 | 7 |
| 14 | Li | 0.5:0.5:1:2.7 | −8 | 4 |
| 15 | Li | 0.2:0.8:1:3.1 | −3 | 7 |
| 16 | Zn | 0.99:0.01:1:2.8 | −7 | 8 |
| 17 | Zn | 0.95:0.05:1:3.2 | −8 | 5 |
| 18 | Zn | 0.9:0.1:1:2.7 | −5 | 6 |
| 19 | Zn | 0.5:0.5:1:3.3 | −8 | 4 |
| 20 | Zn | 0.2:0.8:1:3.2 | −3 | 5 |
| 21 | Pb | 0.99:0.01:1:3.0 | −10 | 8 |
| 22 | Pb | 0.95:0.05:1:2.9 | −9 | 5 |
| 23 | Pb | 0.9:0.1:1:3.1 | −5 | 3 |
| 24 | Pb | 0.5:0.5:1:3.0 | −7 | 4 |
| 25 | Pb | 0.2:0.8:1:2.8 | −2 | 9 |
| 26 | Ba | 0.99:0.01:1:3.2 | −11 | 8 |
| 27 | Ba | 0.95:0.05:1:3.3 | −7 | 5 |
| 28 | Ba | 0.9:0.1:1:3.1 | −5 | 6 |

TABLE 2

Formula: $La_{1-x}M_xNiO_y$

| No. | M | La:M:Ni:O | Seebeck coefficient at 700° C. ($\mu VK^{-1}$) | Electrical resistivity at 700° C. (mΩcm) |
|---|---|---|---|---|
| 29 | Ba | 0.5:0.5:1:2.8 | −4 | 4 |
| 30 | Ba | 0.2:0.8:1:2.9 | −3 | 3 |
| 31 | Ca | 0.99:0.01:1:3.1 | −12 | 8 |
| 32 | Ca | 0.95:0.05:1:3.0 | −8 | 6 |
| 33 | Ca | 0.9:0.1:1:3.3 | −6 | 7 |
| 34 | Ca | 0.5:0.5:1:3.2 | −4 | 4 |
| 35 | Ca | 0.2:0.8:1:2.8 | −7 | 7 |
| 36 | Al | 0.99:0.01:1:3.2 | −10 | 8 |
| 37 | Al | 0.95:0.05:1:2.9 | −8 | 5 |
| 38 | Al | 0.9:0.1:1:3.1 | −8 | 7 |
| 39 | Al | 0.5:0.5:1:3.0 | −6 | 4 |
| 40 | Al | 0.2:0.8:1:3.3 | −5 | 6 |
| 41 | Nd | 0.99:0.01:1:2.9 | −12 | 8 |
| 42 | Nd | 0.95:0.05:1:2.9 | −9 | 7 |
| 43 | Nd | 0.9:0.1:1:3.1 | −5 | 6 |
| 44 | Nd | 0.5:0.5:1:2.8 | −4 | 4 |
| 45 | Nd | 0.2:0.8:1:3.1 | −3 | 4 |
| 46 | Bi | 0.99:0.01:1:3.2 | −10 | 8 |
| 47 | Bi | 0.95:0.05:1:3.0 | −8 | 3 |
| 48 | Bi | 0.9:0.1:1:2.8 | −7 | 7 |
| 49 | Bi | 0.5:0.5:1:2.9 | −4 | 5 |
| 50 | Bi | 0.2:0.8:1:3.0 | −4 | 4 |
| 51 | Y | 0.99:0.01:1:3.2 | −10 | 9 |
| 52 | Y | 0.95:0.05:1:3.3 | −8 | 5 |
| 53 | Y | 0.9:0.1:1:3.2 | −5 | 4 |
| 54 | Y | 0.5:0.5:1:3.0 | −8 | 4 |
| 55 | Y | 0.2:0.8:1:2.8 | −3 | 2 |

TABLE 3

Formula: $(La_{1-x}M_x)_2NiO_y$

| No. | M | La:M:Ni:O | Seebeck coefficient at 700° C. (μVK$^{-1}$) | Electrical resistivity at 700° C. (mΩcm) |
|---|---|---|---|---|
| 56 | Na | 1.98:0.02:1:3.7 | −11 | 9 |
| 57 | Na | 1.9:0.1:1:3.9 | −8 | 7 |
| 58 | Na | 1.8:0.2:1:3.8 | −4 | 7 |
| 59 | Na | 1:1:1:3.8 | −7 | 6 |
| 60 | Na | 0.4:1.6:1:4.0 | −3 | 4 |
| 61 | K | 1.98:0.02:1:3.9 | −9 | 8 |
| 62 | K | 1.9:0.1:1:4.1 | −8 | 9 |
| 63 | K | 1.8:0.2:1:3.6 | −6 | 7 |
| 64 | K | 1:1:1:3.7 | −4 | 7 |
| 65 | K | 0.4:1.6:1:4.2 | −5 | 8 |
| 66 | Li | 1.98:0.02:1:4.4 | −11 | 8 |
| 67 | Li | 1.9:0.1:1:3.8 | −8 | 5 |
| 68 | Li | 1.8:0.2:1:3.7 | −9 | 7 |
| 69 | Li | 1:1:1:3.8 | −4 | 5 |
| 70 | Li | 0.4:1.6:1:4.1 | −5 | 4 |
| 71 | Zn | 1.98:0.02:1:4.2 | −10 | 8 |
| 72 | Zn | 1.9:0.1:1:4.0 | −7 | 7 |
| 73 | Zn | 1.8:0.2:1:3.9 | −5 | 7 |
| 74 | Zn | 1:1:1:3.8 | −4 | 4 |
| 75 | Zn | 0.4:1.6:1:4.1 | −9 | 9 |
| 76 | Pb | 1.98:0.02:1:4.2 | −10 | 8 |
| 77 | Pb | 1.9:0.1:1:3.7 | −11 | 7 |
| 78 | Pb | 1.8:0.2:1:3.9 | −5 | 7 |
| 79 | Pb | 1:1:1:3.8 | −5 | 4 |
| 80 | Pb | 0.4:1.6:1:4.2 | −3 | 4 |
| 81 | Ba | 1.98:0.02:1:4.3 | −6 | 8 |
| 82 | Ba | 1.9:0.1:1:4.2 | −8 | 6 |
| 83 | Ba | 1.8:0.2:1:4.4 | −12 | 7 |

TABLE 4

Formula: $(La_{1-x}M_x)_2NiO_y$

| No. | M | La:M:Ni:O | Seebeck coefficient at 700° C. (μVK$^{-1}$) | Electrical resistivity at 700° C. (mΩcm) |
|---|---|---|---|---|
| 84 | Ba | 1:1:1:3.9 | −4 | 4 |
| 85 | Ba | 0.4:1.6:1:3.8 | −16 | 4 |
| 86 | Ca | 1.98:0.02:1:3.9 | −10 | 8 |
| 87 | Ca | 1.9:0.1:1:4.1 | −3 | 9 |
| 88 | Ca | 1.8:0.2:1:4.2 | −5 | 7 |
| 89 | Ca | 1:1:1:4.3 | −7 | 4 |
| 90 | Ca | 0.4:1.6:1:4.0 | −3 | 8 |
| 91 | Al | 1.98:0.02:1:3.9 | −10 | 8 |
| 92 | Al | 1.9:0.1:1:3.8 | −6 | 5 |
| 93 | Al | 1.8:0.2:1:4.0 | −5 | 7 |
| 94 | Al | 1:1:1:4.1 | −4 | 6 |
| 95 | Al | 0.4:1.6:1:3.8 | −4 | 4 |
| 96 | Nd | 1.98:0.02:1:4.0 | −10 | 8 |
| 97 | Nd | 1.9:0.1:1:3.9 | −12 | 7 |
| 98 | Nd | 1.8:0.2:1:3.7 | −5 | 7 |
| 99 | Nd | 1:1:1:4.2 | −4 | 8 |
| 100 | Nd | 0.4:1.6:1:3.8 | −4 | 4 |
| 101 | Bi | 1.98:0.02:1:4.1 | −13 | 8 |
| 102 | Bi | 1.9:0.1:1:4.0 | −4 | 6 |
| 103 | Bi | 1.8:0.2:1:4.2 | −5 | 7 |
| 104 | Bi | 1:1:1:3.9 | −9 | 8 |
| 105 | Bi | 0.4:1.6:1:4.3 | −3 | 4 |
| 106 | Y | 1.98:0.02:1:4.0 | −10 | 8 |
| 107 | Y | 1.9:0.1:1:4.1 | −8 | 5 |
| 108 | Y | 1.8:0.2:1:3.9 | −7 | 7 |
| 109 | Y | 1:1:1:4.0 | −4 | 4 |
| 110 | Y | 0.4:1.6:1:4.1 | −5 | 9 |

The invention claimed is:

1. A complex oxide having a composition represented by the formula $La_{1-x}M_xNiO_{2.7-3.3}$ wherein M is at least one element selected from the group consisting of Na, K, Li, Zn, Pb, Ba, Al, Nd, Bi and Y, and $0.01 \leq x \leq 0.8$, the complex oxide having a negative Seebeck coefficient at 100° C. or higher.

2. A complex oxide having a composition represented by the formula $La_{1-x}M_xNiO_{2.7-3.3}$ wherein M is at least one element selected from the group consisting of Na, K, Li, Zn, Pb, Ba, Al, Nd, Bi and Y, and $0.01 \leq x \leq 0.8$, the complex oxide having an electrical resistivity of 10 mΩcm or less at 100° C. or higher.

3. A complex oxide having a composition represented by the formula $(La_{1-x}M_x)_2NiO_{3.6-4.4}$ wherein M is at least one element selected from the group consisting of Na, K, Li, Pb, Ca, Al, Nd, Bi and Y, and $0.01 \leq x \leq 0.8$, the complex oxide having a negative Seebeck coefficient at 100° C. or higher.

4. A complex oxide having a composition represented by the formula $(La_{1-x}M_x)_2NiO_{3.6-4.4}$ wherein M is at least one element selected from the group consisting of Na, K, Li, Pb, Ca, Al, Nd, Bi and Y, and $0.01 \leq x \leq 0.8$, the complex oxide having an electrical resistivity of 10 mΩcm or less at 100° C. or higher.

5. An n-type thermoelectric material comprising the complex oxide of any one of claims 1 to 4.

6. A thermoelectric module comprising the n-type thermoelectric material of claim 5.

7. A sintered complex oxide of $La_{1-x}M_xNiO_{2.7-3.3}$ wherein M is at least one element selected from the group consisting of Na, K, Li, Zn, Pb, Al, Nd, Bi and Y, and $0.01 \leq x \leq 0.8$.

8. The sintered complex oxide according to claim 7, which has a negative Seebeck coefficient at 100° C. or higher and/or an electrical resistivity of 10 mΩcm or less at 100° C. or higher.

9. A sintered complex oxide of $(La_{1-x}M_x)_2NiO_{3.6-4.4}$ wherein M is at least one element selected from the group consisting of Na, K, Li, Zn, Pb, Ba, Ca, Al, Nd, Bi and Y, and $0.01 \leq x \leq 0.8$.

10. The sintered complex oxide according to claim 9, which has a negative Seebeck coefficient at 100° C. or higher and/or an electrical resistivity of 10 mΩcm or less at 100° C. or higher.

11. A method of producing the sintered complex oxide of claim 9, comprising:
    mixing starting materials in a metal component ratio of $(La_{1-x}M_x)_2NiO_{3.6-4.4}$ wherein M is at least one element selected from the group consisting of Na, K, Li, Zn, Pb, Ba, Ca, Al, Nd, Bi and Y, and $0.01 \leq x \leq 0.8$; and
    sintering the mixture.

12. The method according to claim 11, wherein the sintering step is conducted at a temperature of about 850° C. to about 1,000° C.

13. The method according to claim 11, further comprising subjecting the starting materials to calcinations prior to the sintering step.

14. A method of producing the sintered complex oxide of claim 7, comprising:
    mixing starting materials in a metal component ratio of $La_{1-x}M_xNiO_{2.7-3.3}$ wherein M is at least one element selected from the group consisting of Na, Li, Zn, Pb, Ba, Al, Nd, Bi and Y, and $0.01 \leq x \leq 0.8$; and
    sintering the mixture.

15. The method according to claim 14, wherein the sintering step is conducted at a temperature of about 850° C. to about 1,000° C.

16. The method according to claim 14, further comprising subjecting the starting materials to calcinations prior to the sintering step.

17. A thermoelectric module comprising:

at least one p-type thermoelectric material and at least one n-type thermoelectric material;

the n-type thermoelectric material being a sintered body of a complex oxide having a composition represented by the formula $La_{1-x}M_xNiO_{2.7-3.3}$ wherein M is at least one element selected from the group consisting of Na, K, Li, Zn, Pb, Ba, Ca, Al, Nd, Bi and Y, and $0.01 \leq x \leq 0.8$; and the complex oxide having a negative Seebeck coefficient at 100° C. or higher.

18. A thermoelectric conversion method comprising:

creating a difference in temperature between both ends of the thermoelectric module according to claim 17.

* * * * *